United States Patent
Chuang et al.

(10) Patent No.: US 9,685,330 B1
(45) Date of Patent: Jun. 20, 2017

(54) MANUFACTURING METHOD OF SEMICONDUCTOR DEVICE

(71) Applicant: Taiwan Semiconductor Manufacturing Co., Ltd., Hsinchu (TW)

(72) Inventors: Kuo-Sheng Chuang, Hsinchu (TW); You-Hua Chou, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 14/968,923

(22) Filed: Dec. 15, 2015

(51) Int. Cl.
*H01L 21/31* (2006.01)
*H01L 21/469* (2006.01)
*H01L 21/027* (2006.01)
*H01L 21/02* (2006.01)
*H01L 21/266* (2006.01)

(52) U.S. Cl.
CPC .... *H01L 21/0273* (2013.01); *H01L 21/02057* (2013.01); *H01L 21/266* (2013.01)

(58) Field of Classification Search
CPC ............. H01L 21/0272; H01L 21/0273; H01L 21/02057; H01L 21/266
See application file for complete search history.

(56) References Cited

U.S. PATENT DOCUMENTS

| | | | | |
|---|---|---|---|---|
| 5,451,295 A | * | 9/1995 | Kroll | G03F 7/42 134/4 |
| 6,099,675 A | * | 8/2000 | Yamamoto | B29C 63/0013 156/241 |
| 2007/0089761 A1 | * | 4/2007 | Banerjee | B08B 3/02 134/34 |
| 2007/0287291 A1 | * | 12/2007 | George | G03F 7/405 438/694 |
| 2010/0112493 A1 | * | 5/2010 | Adelung | H01L 21/0272 430/322 |
| 2015/0136183 A1 | * | 5/2015 | Brown | H01L 21/67051 134/95.3 |

* cited by examiner

*Primary Examiner* — Zandra Smith
*Assistant Examiner* — John M Parker
(74) *Attorney, Agent, or Firm* — Jianq Chyun IP Office

(57) ABSTRACT

Methods for manufacturing semiconductor devices are disclosed. A photoresist layer is formed over a substrate. A cryogenic process is performed on the photoresist layer. After the cryogenic process, a cleaning process is performed on the photoresist layer to remove the photoresist layer.

20 Claims, 8 Drawing Sheets

MANUFACTURING METHOD OF SEMICONDUCTOR DEVICE

BACKGROUND

In one example conventional process, a photoresist layer is applied on a substrate and patterned so that some areas of the substrate are exposed. The exposed areas are then implanted with dopants. However, the implantation process may chemically change an outer portion of the photoresist layer so that the outer portion includes tough polymers with inter-molecular bonds. The chemically changed outer portion of the photoresist layer may make the photoresist layer more difficult to remove using conventional techniques.

DETAILED DESCRIPTION

Figure 1:
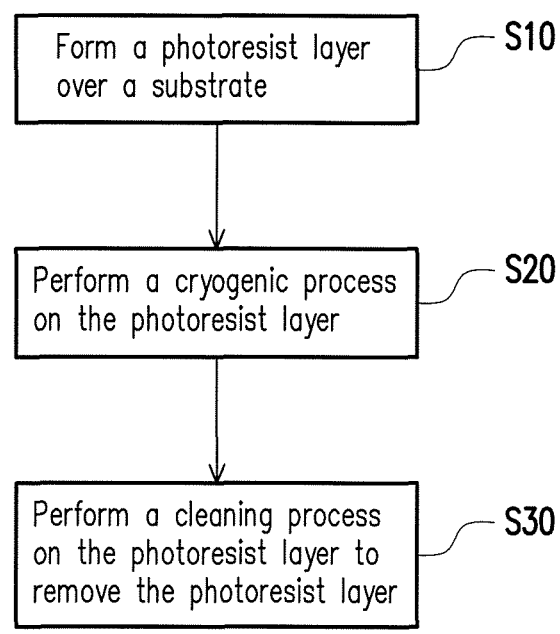
FIG. 1 is a flowchart showing a manufacturing method of an integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative tell are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart showing a manufacturing method of a semiconductor device in accordance with some embodiments. FIG. 2A through FIG. 2E are schematic views showing a manufacturing method of a semiconductor device in accordance with some embodiments.

Figure 2A:
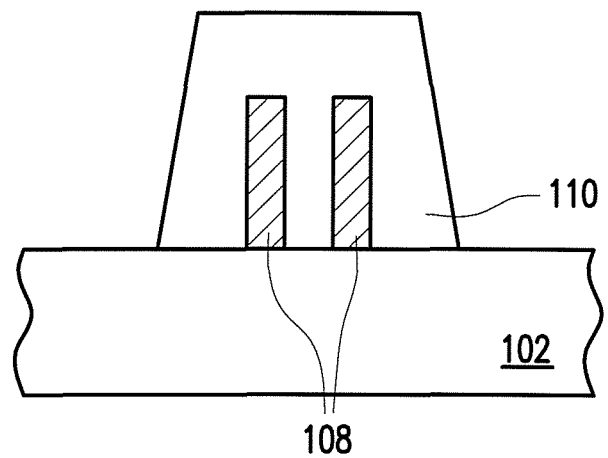
FIG. 2A through FIG. 2E are schematic views showing a manufacturing method of an integrated circuit in accordance with some embodiments.

Referring to FIGS. 1 and 2A, in Step S10, a photoresist layer 110 is formed over a substrate 102. In some embodiments, the substrate 102 is a semiconductor substrate, such as a silicon substrate, a silicon-on-insulator (SOI) substrate, a silicon germanium substrate, or a substrate formed of other suitable semiconductor materials. Depending on the requirements of design, the substrate 102 may be a P-type substrate or an N-type substrate and may have doped regions (e.g., n-wells and p-wells) formed therein. In alternative embodiment, the substrate 102 has one or more layers (e.g., insulating layers, conductive layers, etc.) formed thereon.

In some embodiments, a structure 108 is formed over the substrate 102. The structure 108 is any component of the semiconductor device, which is susceptible to damage during performing process on other components or the substrate 102 of the semiconductor device. In some embodiments, the structure 108 is a conductive pattern such as a conductive line or a dielectric pattern such as an inter-metal dielectric (IMD) layer. In some embodiments, a material of the structure 108 is a conductive material such as metal, metal alloy, metal silicide, polysilicon or a combination thereof, or a dielectric material such as silicon oxide, silicon nitride, silicon oxynitride or a combination thereof.

In some embodiments, the photoresist layer 110 is applied to the substrate 102 and patterned to have the shape shown in FIG. 2A. In some embodiments, the photoresist layer 110 is applied to protect the structure 108 during other processing steps that might damage or alter the structure 108, such as etching, implantation, and the like. In some embodiments, the photoresist layer 110 may be formed using a spin-on coating process. In some embodiments, the photoresist layer 110 has a thickness ranging from 0.01 um to 10 um. In some embodiments, the photoresist layer 110 is a negative or positive type photoresist of any suitable composition. In some embodiments, the negative type photoresist includes a photosensitive composition, such as polyisoprene, diazonaphthoquinone (DNQ) or the like. In some embodiments, the positive type photoresist includes a photosensitive composition, such as phenol-formaldehyde resin, epoxy resin or the like. The photoresist may be soft baked after its deposition. After the photoresist is baked, an exposure process is performed on the photoresist. The exposure process patterns the photoresist. In some embodiments, the exposure process may include introducing a radiation beam to the substrate 102. In some embodiments, the radiation beam may be ultraviolet and/or can be extended to include other radiation beams such as ion beam, x-ray, extreme ultraviolet, deep ultraviolet, or other proper radiation energy. The exposure process may be part of an immersion lithography process, electron-beam writing, ion-beam writing, maskless photolithography, molecular imprint, and/or other suitable patterning processes. A post-exposure bake (PEB) may be performed to allow the exposed photoresist polymers to cleave.

In some embodiments, after PEB, the exposed photoresist is developed (e.g., a developer is applied to the patterned photoresist to remove the soluble portions of the photoresist). The substrate 102 and the exposed photoresist including the cleaved polymer are transferred to a developing chamber to remove portions of the photoresist (e.g., the exposed photoresist) that is soluble to an aqueous developer. In some embodiment, the developer is tetra-methyl ammonium hydroxide (TMAH). In alternative embodiment, other suitable compositions now known or later developed are used. In alternative embodiment, a surfactant may also be included. The surfactant may selected from surfactants such as, 3M Novec fluid HFE-7000, HFE-7100, HFE-7200, HFE-7500, HFE-711PA. 3M Fluorinert FC-72, FC-84, FC-77, FC-3255, FC-3283, FC-40, FC-43, FC-70. 3M Novec 4200, 3M Novec 4300, 3M FC-4432. 3M FC-4430, 3M FC-4434 and/or other surfactants known in the art. In some embodiments, the developer may be applied by a puddling process, immersion, spray, and/or other suitable methods. After the development process, an etching process is performed to remove a portion of the photoresist. Then, as shown in FIG. 2A, the photoresist layer 110 is formed and has been patterned to have the shape. In some embodiments, the photoresist layer 110 exposes a portion of the substrate 102 aside the structure 108 and protects the structure 108 over the substrate 202. In alternative embodiments, a layer for promoting adherence of the photoresist layer 110 is formed over the substrate 102 before forming the photoresist layer 110. The layer for promoting adherence of the photoresist layer 110 is, for example, a hexamethyldisilazane (HMDS) layer.

Figure 2B:
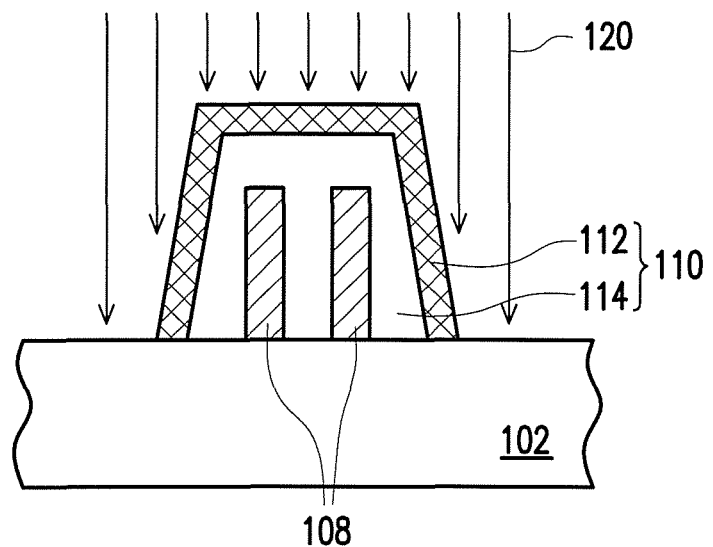

Referring to FIGS. 1 and 2B, in some embodiments, a portion of the photoresist layer 110 is chemically changed to a photoresist crust 112. In some embodiments, after the photoresist layer 110 is formed over the structure 108, an implantation process 120 is performed on the photoresist layer 110. In some embodiments, the implantation process 120 is used to change the conductivity or remove a portion of the substrate 102 or other components of the semiconductor device while the photoresist layer 110 is used as a masking element to protect the structure 108 from being damaged or altered. In some embodiments, an energy of the implantation process 120 ranges from 0.5 KeV to 2000 KeV. In some embodiments, a dose of the dopants ranges from 1e13/cm² to 1e16/cm². During the implantation process 120, a portion of the photoresist layer 110 may be changed chemically to the photoresist crust 112 due the chemicals and heat to which it is exposed. In some embodiments, an outer surface of the photoresist layer 110 has been changed to the photoresist crust 112, and an inner of the photoresist layer 110 remains unchanged and is referred to a photoresist bulk 114. In some embodiments, during the implantation process 120, M⁺ ion is doped into the photoresist layer 110, wherein M is, for example, such as boron (B), phosphorus (P) or arsenic (As). Thus, some of the polymers in the photoresist layer 110 are highly cross-linked, and changed into the polymers forming the photoresist crust 112. In some embodiments, the photoresist crust 112 is formed over a top portion or side portions of the photoresist bulk 114. The photoresist crust 112 is relatively more difficult to be removed than the photoresist bulk 114. For example, compared with the photoresist bulk 114, the photoresist crust 112 has to be removed by a photoresist stripper at a higher temperature, or a plasma ashing process in a longer time while causing a loss of a portion of the substrate 102.

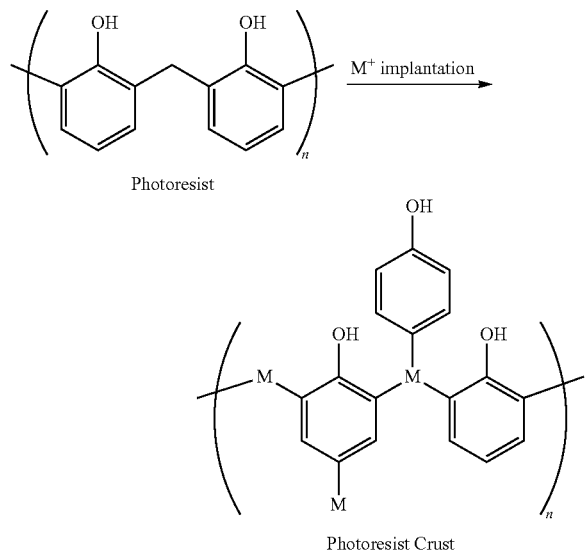

In alternative embodiments, the photoresist layer 110 may include deep ultraviolet (DUV) photoresist, such as a photoresist for 248 nm exposure by a Krypton Fluoride (KrF) Excimer Laser. In this example, after the implantation process 120, some of the polymers in the photoresist layer 110 have been chemically changed to microcrystalline graphite and long, single carbon chains and form the photoresist crust 112. In alternative embodiments, compared with the photoresist bulk 114, the photoresist crust 112 may be resistant to plasma ashing and may further lead to increased residue after the plasma ashing process. In alternative embodiments, a plasma etching process may also chemically change a portion of the photoresist layer 110 to the photoresist crust 112.

Figure 2C:
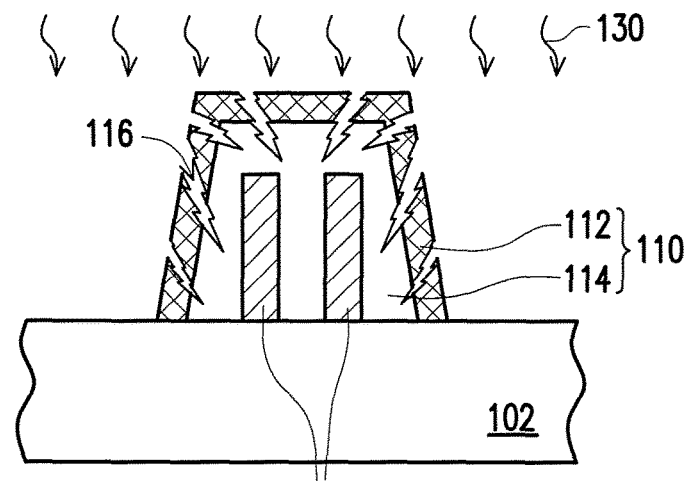

Referring to FIGS. 1 and 2C, in Step S20, a cryogenic process 130 is performed on the photoresist layer 110. In some embodiments, the photoresist crust 112 is exposed to the cryogenic process 130, and the photoresist crust 112 becomes fragile. In some embodiments, the photoresist crust 112 becomes fragile due to inter-molecular bonds in the polymers of the photoresist crust 112 being broken. In some embodiments, microcracks 116 are formed in the photoresist crust 112 and the photoresist crust 112 of the photoresist layer 110 is substantially broken into several fragments with the microcracks 116 therebetween. In some embodiments, the microcracks 116 are, for example, further extended into the photoresist bulk 114. In some embodiments, a temperature of the cryogenic process 130 is, for example, from −210° C. to −272° C. In some embodiments, the cryogenic process 130 is performed by using a low temperature liquid gas such as liquid nitrogen, liquid oxygen, liquid argon or the like. In some embodiments, the cryogenic process 130 is a batch wafer processing or single wafer processing, and performed by an immersion method, a spray method, or the like. In the batch wafer processing, 1 to 25 pieces of wafers are simultaneously immersed in a can supplying with a low temperature liquid gas at a flow rate of 10 ml/min to 1000 ml/min. In the single wafer processing, one wafer is sprayed with a low temperature liquid gas at a flow rate of 500 ml/min to 2500 ml/min. Compared with the photoresist crust 112 shown in FIG. 2B, the photoresist crust 112 processed with the cryogenic process 130 and having the microcracks 116 therein is easier to be removed. In addition, in some embodiments, the microcracks 116 expose a portion of the photoresist bulk 114 of the photoresist layer 110.

Figure 2D:
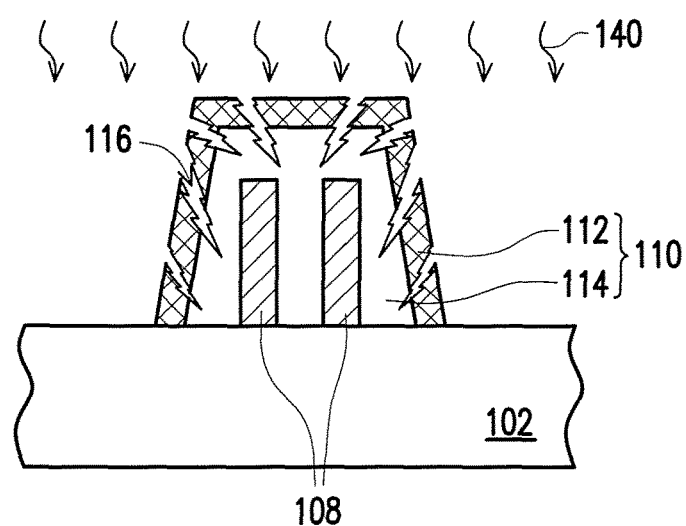
Figure 2E:
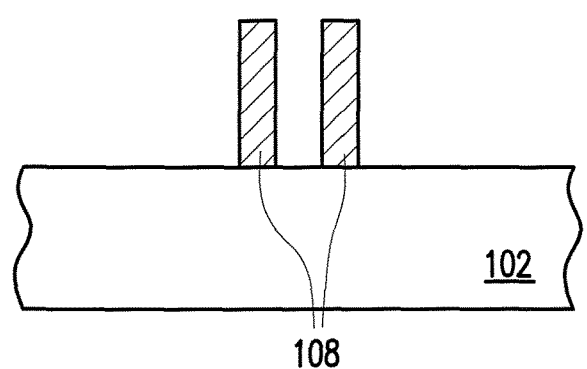

Referring to FIGS. 1 and 2D, in Step S30, after performing the cryogenic process 130, a cleaning process 140 is performed on the photoresist layer 110 to remove the photoresist layer 110. In some embodiments, the cleaning process 140 is performed by supplying a photoresist stripper to the photoresist layer 110. In some embodiments, the photoresist stripper is an ozone liquid, which is formed by mixing ozone gas and a deionized water. In some embodiments, the ozone liquid includes between approximately 15 ppm and 200 ppm of ozone. In some embodiments, the ozone is made with an ozone generator, and there is very little or no O₂ in the process. In some embodiments, the deionized water is supplied to the substrate 102. The deionized water has a temperature less than a temperature of the substrate 102. In some embodiments, the temperature of the deionized water is about 15° C. or less. The deionized water lowers the substrate temperature which mitigates thermal shock or other damage to the substrate 102 while enhancing stripping capabilities of the ozone liquid. In some embodiments, an activator, such as an ultraviolet activator or a hydrogen peroxide activator, is supplied to the ozone liquid to create the activated ozone liquid.

In alternative embodiments, the photoresist stripper is a sulfuric acid hydrogen peroxide mixture (SPM), which is formed by mixing sulfuric acid and hydrogen peroxide immediately before using. In alternative embodiments, concentration of sulfuric acid is generally between 95% to 98%, and a temperature thereof is 60° C. to 200° C. In alternative embodiments, concentration of hydrogen peroxide is generally between 25% to 33%, and a temperature thereof is 20° C. to 30° C. In alternative embodiments, concentration of sulfuric acid is 98%, and concentration of hydrogen peroxide is 30%. In alternative embodiments, a volume ratio of sulfuric acid and hydrogen peroxide is 1:1 to 12:1. In some embodiment, the cryogenic process 130 and the cleaning process 140 are performed in different chambers.

In some embodiments, the photoresist layer 110 is processed by the cryogenic process 130 before removed by the cleaning process 140. In some embodiments, the photoresist crust 112 becomes fragile and forms the microcracks therein after processed by the cryogenic process 130, and therefore the photoresist layer 110 including the photoresist crust 112 is easily removed by the cleaning process 140. Accordingly, gentle photoresist stripper may be used in the cleaning process 140 and the photoresist layer 110 can be removed more quickly, and the structure 108 or the substrate 102 susceptible to damage during removal of the photoresist layer 110 is prevented from being damage.

Figure 3A:
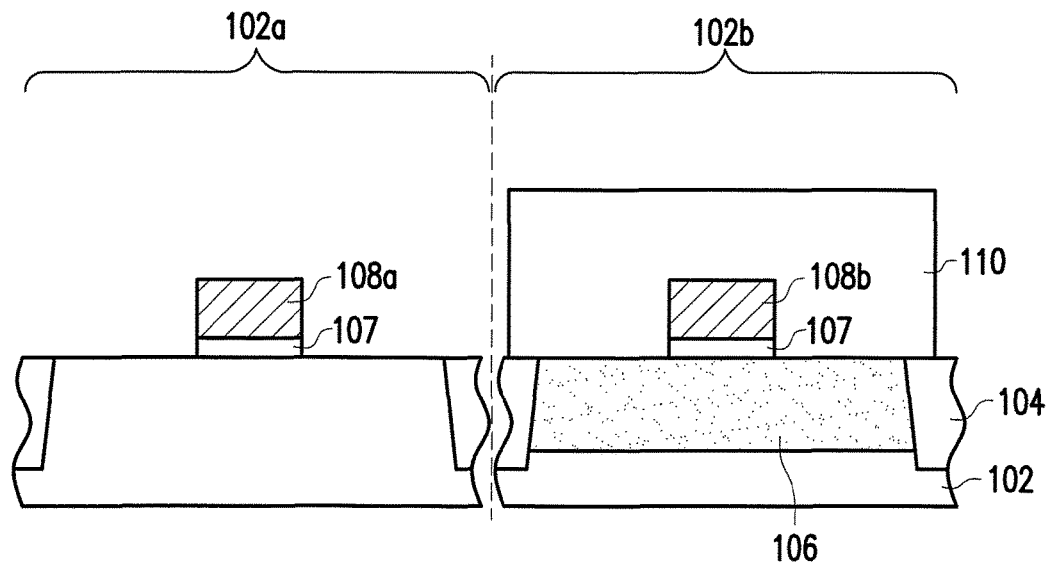
FIG. 3A through FIG. 3I are schematic views showing a manufacturing method of an integrated circuit in accordance with some embodiments.

FIG. 3A through FIG. 3I are schematic views showing a manufacturing method of a semiconductor device in accordance with some embodiments. Referring to FIG. 3A, a photoresist layer 110 is formed over a substrate 102. In some embodiments, the substrate 102 includes a first region 102a for one or more semiconductor components (e.g., FET) and a second region 102b for one or more semiconductor components (e.g., FET). In some embodiments, shallow trench isolation (STI) features 104 are formed in the substrate 102. The formation of the STI features 104 includes etching a trench in the substrate 102 and filling the trench by one or more insulator materials such as silicon oxide, silicon nitride, or silicon oxynitride. The filled trench may have a multi-layer structure such as a thermal oxide liner layer with silicon nitride filling the trench. In alternative embodiment, the STI feature 104 is created using a process sequence such as: growing a pad oxide, forming a low pressure chemical vapor deposition (LPCVD) nitride layer, patterning an STI opening using photoresist and mask, etching a trench in the substrate, optionally growing a thermal oxide trench liner to improve the trench interface, filling the trench with CVD oxide, using chemical mechanical planarization (CMP) to etch back, and using nitride stripping to leave the STI feature 104. In some embodiments, a doped region 106 is formed therein. In some embodiments, the substrate 102 is a P-type substrate, and the doped region 106 is an n-well, for example. In alternative embodiments, the substrate 102 is an N-type substrate, and the doped region 106 is p-well, for example.

In some embodiments, structures 108a, 108b are respectively formed in the first and second regions 102a, 102b. In some embodiments, the structures 108a, 108b are, for example, gate structures. In some embodiments, a material of the structure 108a, 108b is a conductive material, such as metal, metal alloy, metal silicide, polysilicon or a combination thereof. In some embodiments, a dielectric layer 107 is formed between the substrate 102 and the structure 108a, 108b. In some embodiments, a material of the dielectric layer 107 is silicon oxide, a high dielectric constant (high-k) material or a combination thereof. In some embodiments, the high-k material has a dielectric constant of greater than about 4 or even greater than about 10. In some embodiments, the high-k material includes metal oxide, such as titanium oxide ($TiO_2$), zirconium oxide ($ZrO_2$), hafnium oxide ($HfO_2$), tantalum oxide ($Ta_2O_5$), and barium and strontium titanium oxide (($Ba,Sr)TiO_3$) or a combination thereof. In alternative embodiments, spacers are formed on a sidewall of the structure 108a, 108b.

In some embodiment, a photoresist layer 110 is applied to the second region 102b of the substrate 102 to cover the structure 108b. In some embodiments, the photoresist layer 110 is used as a masking element to protect the structure 108b from being damaged or altered.

Figure 3B:
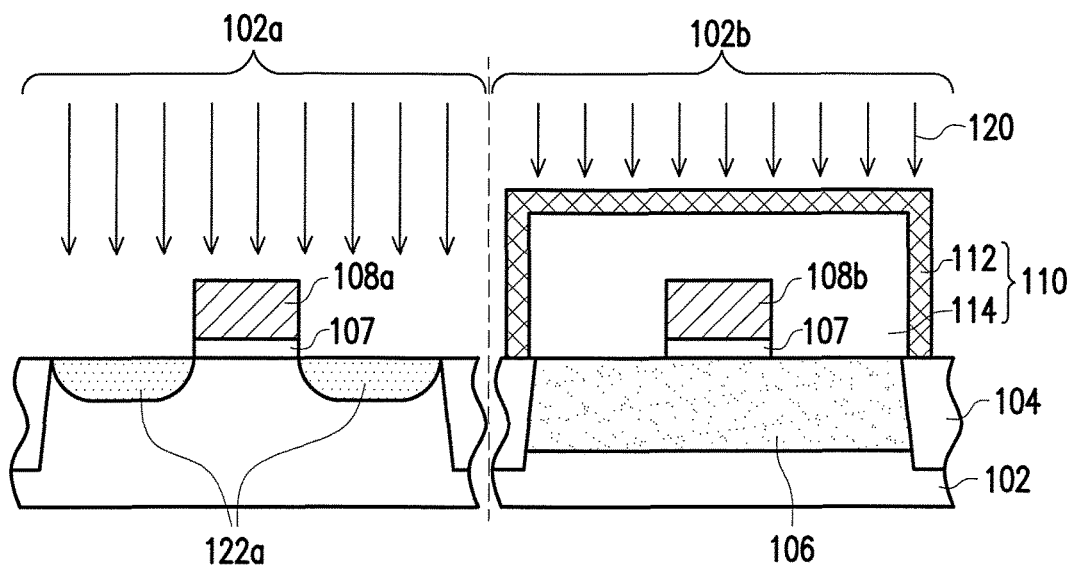

Referring to FIG. 3B, an implantation process 120 is performed in the first region 102a of the substrate 102 to form doped regions 122a. In some embodiments, the implantation process 120 is performed by using n-type dopants such as phosphorus, arsenic, and antimony. In some embodiments, the doped regions 122a are formed aside the structure 108a by using the structure 108a as a mask. In some embodiments, the substrate 102 is a P-type substrate, and the doped regions 122a are n-type source and drain regions, for example. In some embodiments, during the implantation process 120, a portion of the photoresist layer 110 is chemically changed to a photoresist crust 112, and the other portion of the photoresist layer 110 is unchanged and refers to a photoresist bulk 114.

Figure 3C:
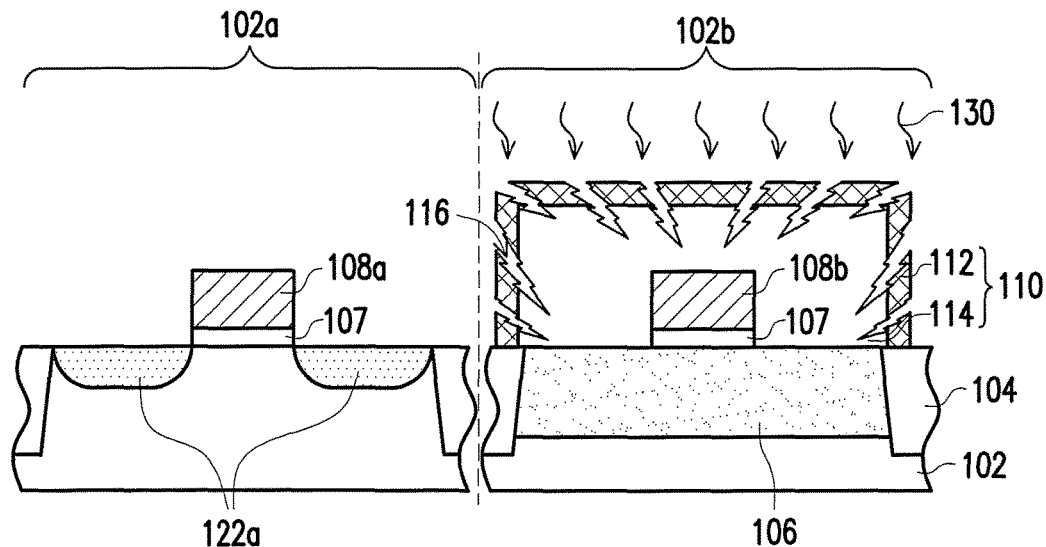

Referring to FIG. 3C, a cryogenic process 130 is performed on the photoresist layer 110. In some embodiments, microcracks 116 are formed in the photoresist crust 112 of the photoresist layer 110 and further extended into the photoresist bulk 114 of the photoresist layer 110. In some embodiments, the photoresist crust 112 becomes fragile and is easy to be removed.

Figure 3D:
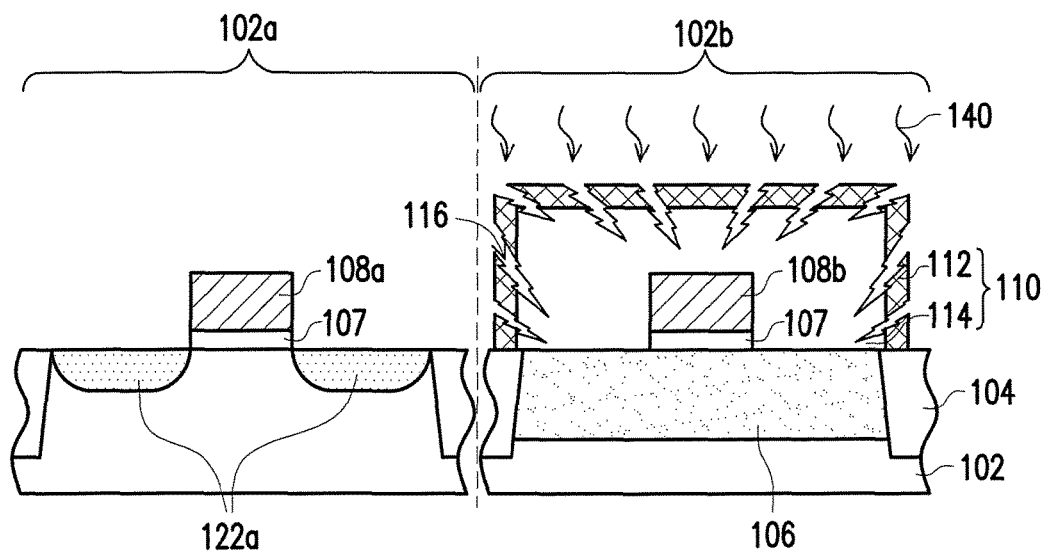
Figure 3E:
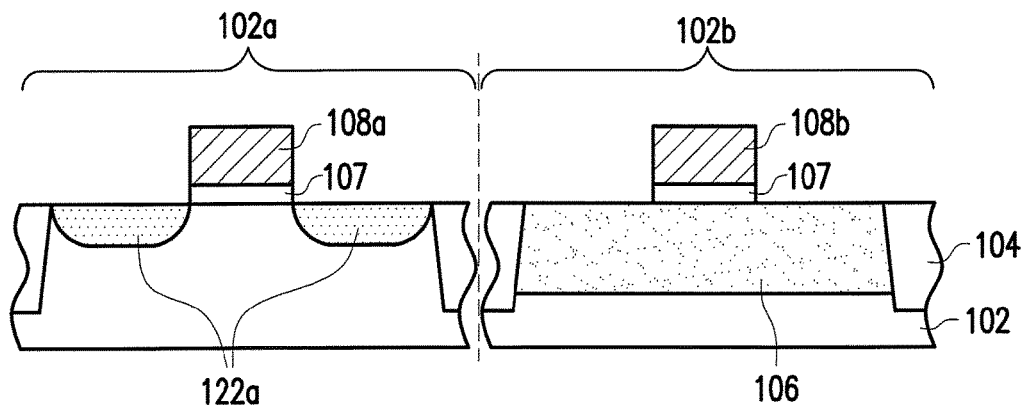

Referring to FIGS. 3D and 3E, after performing the cryogenic process 130, a cleaning process 140 is performed on the photoresist layer 110 to remove the photoresist layer 110. In some embodiments, the photoresist crust 112 with the microcracks 116 and the photoresist bulk 114 of the photoresist layer 110 are removed. In some embodiments, a photoresist stripper is contact with the photoresist bulk 114 through the microcracks 116.

Figure 3F:
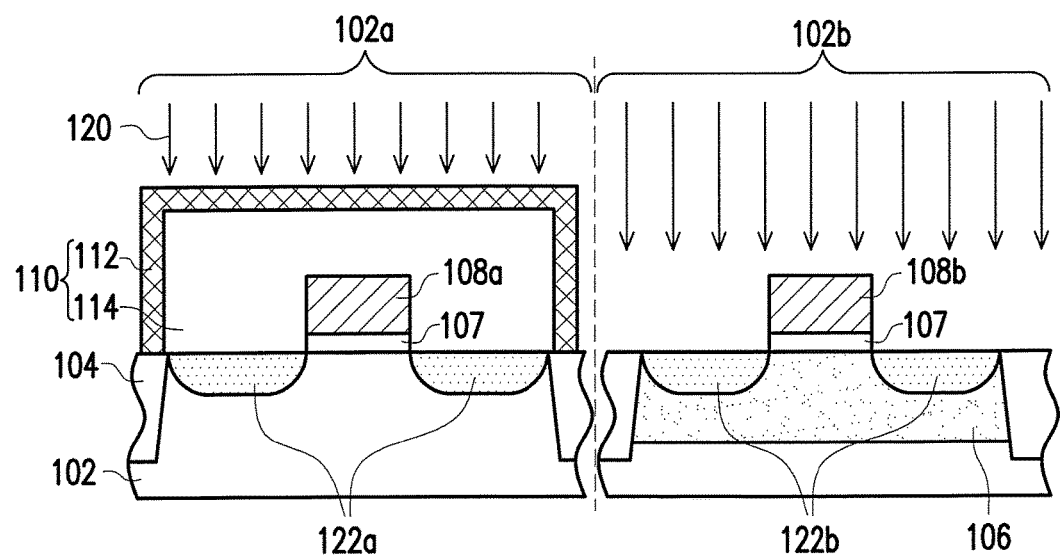

Referring to FIG. 3F, a photoresist layer 110 is applied to the first region 102a of the substrate 102 to cover the structure 108a. Then, an implantation process 120 is performed in the second region 102b of the substrate 102 to form doped regions 122b. In some embodiment, the photoresist layer 110 is used as a masking element to protect the structure 108a from being damaged or altered. In some embodiments, the implantation process 120 is performed by using p-type dopants such as boron, indium, aluminum, and gallium. In some embodiments, the doped regions 122b are formed aside the structure 108b in the doped region 106 by using the structure 108b as a mask. In some embodiments, the doped region 106 is an n well, and the doped regions 122b are p-type source and drain regions, for example. In some embodiments, during the implantation process 120, a portion of the photoresist layer 110 is chemically changed to a photoresist crust 112, and the other portion of the photoresist layer 110 is unchanged and refers to a photoresist bulk 114.

Figure 3G:
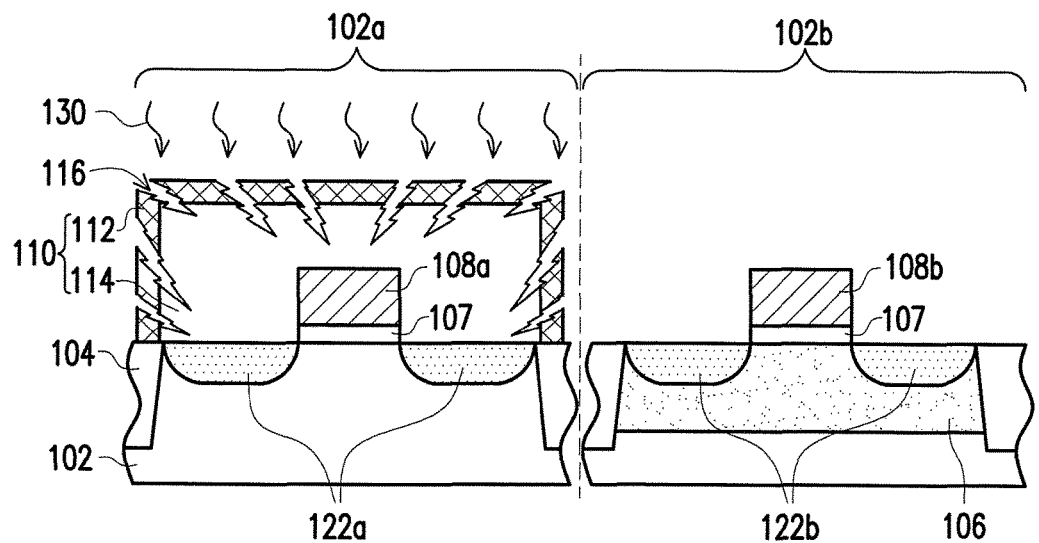

Referring to FIG. 3G, a cryogenic process 130 is performed on the photoresist layer 110. In some embodiments, microcracks 116 are formed in the photoresist crust 112 of the photoresist layer 110 and further extended into the photoresist bulk 114 of the photoresist layer 110. In some embodiments, the photoresist crust 112 becomes fragile and is easy to be removed.

Figure 3H:
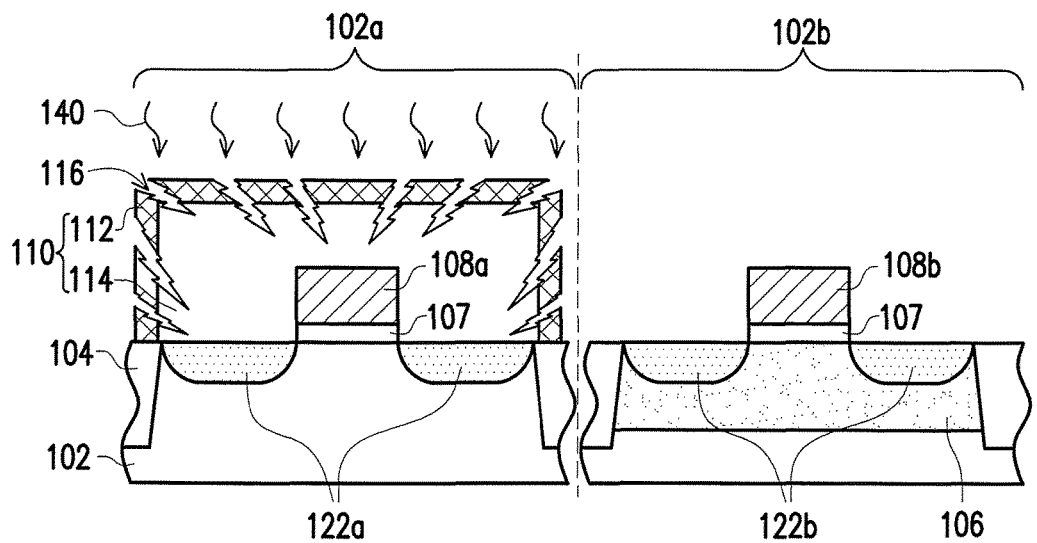
Figure 3I:
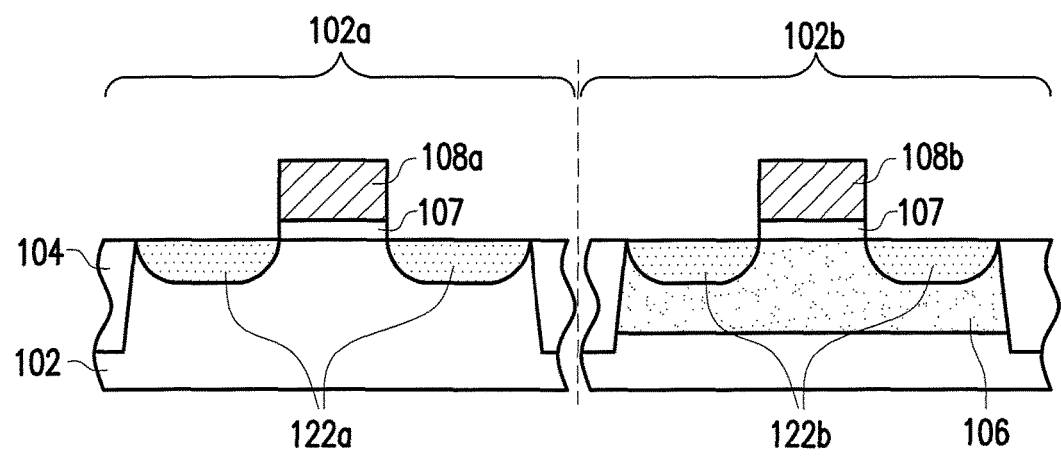

Referring to FIGS. 3H and 3I, after performing the cryogenic process 130, a cleaning process 140 is performed on the photoresist layer 110 to remove the photoresist layer 110. In some embodiments, the photoresist crust 112 with the microcracks 116 and the photoresist bulk 114 of the photoresist layer 110 are removed. In some embodiments, a photoresist stripper is contact with the photoresist bulk 114 through the microcracks 116.

In some embodiments, the photoresist layer including the outer crust is removed by the cryogenic process and the cleaning process sequentially. In the cryogenic process, the photoresist layer is processed with the low-temperature liquid gas by the immersion method or the spraying method, and thus the photoresist crust including the cross-linked polymers becomes fragile and forms mirocracks therein. Thereafter, in the cleaning process, the gentle photoresist stripper may penetrates the broken photoresist crust and dissolves the photoresist bulk, and thus the photoresist is removed easily. In some embodiments, the photoresist layer including the crust and the bulk is removed easily and completely, and thus the photoresist may be removed at low temperature and by using gentle chemicals such as ozone-based chemical. Moreover, the structure covering by the photoresist layer is prevented from being damaged. Accordingly, the cost for removing the photoresist is lower, the method for removing the photoresist becomes more environmental friendly, and the semiconductor device has better performance.

A manufacturing method of a semiconductor device includes the following. A photoresist layer is formed over a substrate. A cryogenic process is performed on the photoresist layer. After the cryogenic process, a cleaning process is performed on the photoresist layer to remove the photoresist layer.

A manufacturing method of a semiconductor device includes the following. A patterned photoresist layer is formed over a substrate to cover a structure. An implantation process is performed in the substrate, wherein the implantation process chemically changes a first portion of the patterned photoresist layer. A cryogenic process is performed on the patterned photoresist layer. After the cryogenic process, a cleaning process is performed on the patterned photoresist layer to remove the photoresist layer.

A method for manufacturing a semiconductor device includes the following. A photoresist layer is formed over a substrate, wherein the photoresist layer includes a photoresist crust. A cryogenic process is performed on the photoresist layer, thereby causing microcracks in the photoresist crust. After the cryogenic process, a cleaning process is performed on the photoresist layer to remove the photoresist layer.

The foregoing outlines features of several embodiments so that those skilled in the art may better understand the aspects of the present disclosure. Those skilled in the art should appreciate that they may readily use the present disclosure as a basis for designing or modifying other processes and features for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device, the method comprising:
    forming a photoresist layer over a substrate to cover a structure;
    performing a cryogenic process on the photoresist layer, wherein microcracks are formed in the photoresist layer and do not fully penetrate through the photoresist layer to expose the structure; and
    after the cryogenic process, performing a cleaning process to remove the photoresist layer.

2. The method of claim 1, wherein the microcracks are formed in a portion of the photoresist layer.

3. The method of claim 1, wherein the cryogenic process comprises using a liquid gas.

4. The method of claim 1, wherein the cryogenic process is performed by an immersion method or a spray method.

5. The method of claim 1, wherein the cleaning process comprises using a sulfuric acid hydrogen peroxide mixture.

6. The method of claim 1, wherein the cleaning process comprises using an ozone liquid.

7. A method for manufacturing a semiconductor device, the method comprising:
    forming a patterned photoresist layer over a substrate to cover a structure;
    performing an implantation process in the substrate, wherein the implantation process chemically changes a first portion of the patterned photoresist layer;
    performing a cryogenic process on the patterned photoresist layer, wherein microcracks are formed in the photoresist layer and do not fully penetrate through the patterned photoresist layer to expose the structure; and
    after the cryogenic process, performing a cleaning process to remove the patterned photoresist layer.

8. The method of claim 7, wherein the microcracks are formed in the first portion.

9. The method of claim 7, wherein the first portion is an outer surface of the photoresist layer.

10. The method of claim 7, wherein the first portion includes highly cross-linked polymers after the implantation process.

11. The method of claim 7, wherein a second portion of the patterned photoresist layer is covered by the first portion and not chemically changed after the implantation process.

12. The method of claim 7, wherein the implantation process forms doped regions in the substrate aside the structure.

13. The method of claim 7, wherein the cryogenic process comprises using a liquid gas.

14. The method of claim 7, wherein the cryogenic process is performed by an immersion method or a spray method.

15. The method of claim 7, wherein the cleaning process comprises using a sulfuric acid hydrogen peroxide mixture.

16. The method of claim 7, wherein the cleaning process comprises using an ozone liquid.

17. A method for manufacturing a semiconductor device, the method comprising:
    forming a photoresist layer over a substrate to cover a structure, wherein the photoresist layer comprises a photoresist crust;
    performing a cryogenic process on the photoresist layer, wherein microcracks are formed in the photoresist crust and do not fully penetrate through the photoresist layer to expose the structure; and
    after the cryogenic process, performing a cleaning process on the photoresist layer to remove the photoresist layer.

18. The method of claim 17, wherein the photoresist crust is formed in an outer surface of the photoresist layer.

19. The method of claim 18, wherein the microcracks are further extended into an inner portion of the photoresist layer.

20. The method of claim 17, wherein the cryogenic process comprises using a liquid gas.

* * * * *